(12) United States Patent
Richard et al.

(10) Patent No.: US 6,713,937 B2
(45) Date of Patent: Mar. 30, 2004

(54) MINITAB RECTIFIER FOR ALTERNATORS

(75) Inventors: Hugh Richard, Meopham (GB); Alberto Guerra, Palos Verdes Estates, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/445,472

(22) Filed: May 27, 2003

(65) Prior Publication Data

US 2003/0197265 A1 Oct. 23, 2003

Related U.S. Application Data

(62) Division of application No. 09/909,454, filed on Jul. 19, 2001, now Pat. No. 6,627,975.
(60) Provisional application No. 60/274,991, filed on Mar. 12, 2001.

(51) Int. Cl.⁷ .................. G21H 1/00; H01L 29/861; H01L 31/107; H01L 29/00; H01L 29/06; H01L 23/495; H01L 23/02; H01L 23/52; H01L 23/28
(52) U.S. Cl. .................. 310/303; 257/658; 257/625; 257/603; 257/551; 257/481; 257/199; 257/666; 257/675; 257/678; 257/691; 257/787
(58) Field of Search .................. 257/144, 152, 257/150, 175, 176, 177, 181, 203, 207, 208, 355, 481, 551, 603, 625, 658, 666, 675, 676, 678, 688, 690, 691, 692, 693, 698, 734, 737

(56) References Cited

U.S. PATENT DOCUMENTS

| 4,283,838 A | * | 8/1981 | Yamane et al. | 438/112 |
| 4,686,445 A | * | 8/1987 | Phillips | 322/89 |
| 5,886,403 A | * | 3/1999 | Yoshinaga et al. | 257/688 |
| 6,118,639 A | * | 9/2000 | Goldstein | 361/55 |
| 6,335,548 B1 | * | 1/2002 | Roberts et al. | 257/98 |

OTHER PUBLICATIONS http://www.national.com/packaging/folders/ta09a.html National Semicondutor specifiactions of TO220 standard chip geometric layout.*

* cited by examiner

Primary Examiner—Nathan J. Flynn
Assistant Examiner—Victor A. Mandala, Jr.
(74) Attorney, Agent, or Firm—Ostrolenk, Faber, Gerb & Soffen, LLP

(57) ABSTRACT

A diode for use in an under-the-hood automotive application has a TO 220 outline and consists of a diode die on a two piece lead frame which has a thick section to which the bottom of the die is soldered, and a thinner section which extends through a plastic housing as a connection tab and which has a forked end for easy connection to a node of a three phase bridge. The bottom of the thickened section is exposed through the insulation housing for easy connection to a d-c heat sink rail. The diode is particularly useful in applications greater than 2 KW.

8 Claims, 5 Drawing Sheets

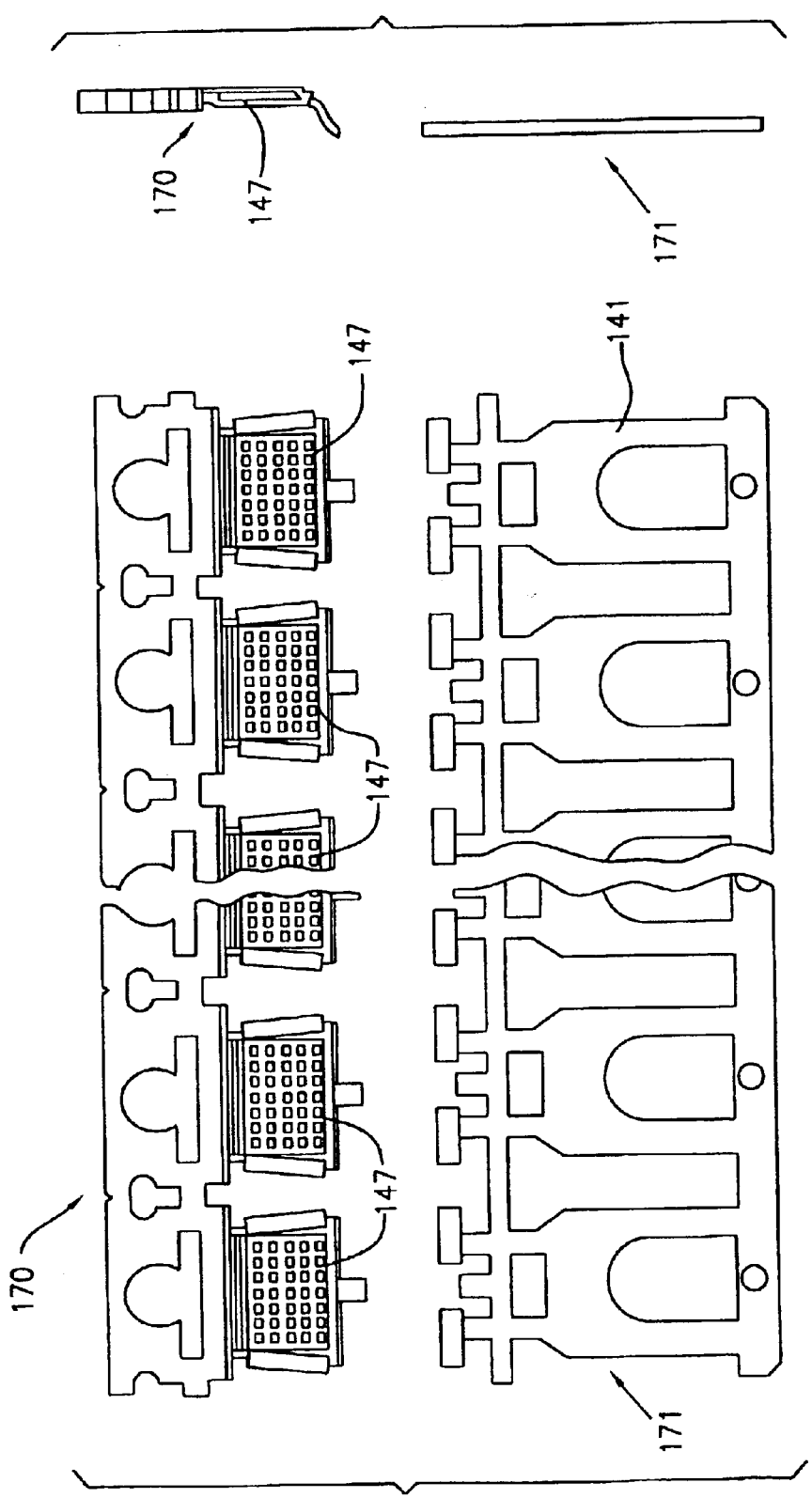

MINITAB RECTIFIER FOR ALTERNATORS

RELATED APPLICATIONS

This application is a divisional of U.S. application Ser. No. 09/909,454, filed Jul. 19, 2001 now U.S. Pat. No. 6,627,975, entitled MINITAB RECTIFIER FOR ALTERNATORS which claims priority to U.S. Provisional Application No. 60/274,991, filed Mar. 12, 2001.

FIELD OF THE INVENTION

This invention relates to semiconductor devices and more specifically relates to a novel diode structure for application to automotive structures.

BACKGROUND OF THE INVENTION

Semiconductor devices are commonly used in automotive applications such as in three-phase bridge designs for automotive alternators. These are generally mounted in the hostile environment of "under-hood" locations. Despite this hostile environment (heat, vibration, shock forces, etc.), high reliability and thermal efficiency are key requirements.

Button diodes of a well-known type are commonly used for automotive alternators. Such button diodes have a cylindrical shape with a cylindrical conductive outer rim and flat top and bottom electrodes which are insulated from the rims, and define the cathode and anode electrodes of the device. These button diodes are commonly mounted on two separate heat sink sections which form the positive and negative d-c rails for the output of the three-phase bridge circuit. The cathode electrodes of the diodes are mounted on the negative bus and the three other button diodes are flipped over with their anodes mounted on the positive bus.

Conventional button diodes have been found to be unreliable for alternator outputs above about 2 kW, which is needed for many modern automotive alternator applications. Further, the upper-facing or free electrode of the button diode requires a separate clip connector for connection to the circuit a-c output leads and to terminate either the anode or cathode terminal of the button diode.

It would be desirable to provide a diode structure which is reliable for operation in an alternator application at output powers in excess of 2 kW, and which can be applied to existing alternator structures and heat sinks.

BRIEF DESCRIPTION OF THE INVENTION

In accordance with the invention, a novel alternator diode is provided which can directly replace a button diode in an existing alternator structure, but can be reliably used for higher output power.

The novel diode of the invention consists of a diode package of a TO 220 type outline and which has an internal diode die having one electrode mounted to a first lead frame section and its other electrode wire bonded to an extending second lead frame tab which is insulated from the first section. The die and lead frame sections are over-molded with a conventional plastic housing, with the bottom of the first lead frame section exposed for surface mounting and with the second and tab section of the lead frame extending through the side wall of the housing. The end of the second section is preferably forked to define an easy screw or bolt connector connection to the common a-c connection. The exposed bottom surface of the first section and the extending tab are preferably metallized with a solderable finish. The die within the package can be mounted with the anode side up or down to define the diode to be connected to the positive or negative d-c bus respectively.

In one embodiment of the invention, the diode may be a Zener diode which, at 25° C. has a Zener voltage of 28/33 volts; a forward voltage drop of 1 volt at 100 amperes; an R junction-case of 0.6° C./W; a lead current rating greater than 75 amperes and an $I_{AV}$ (180° Rect.) of 80 amperes at a case temperature of 125° C. This rating is suitable for many alternator designs with outputs available above the 3 kW level. Further, the novel structure provides lower assembly costs and, critically, more reliable operation at higher power in the hostile "under-hood" environment.

BRIEF DESCRIPTION OF THE DRAWINGS

FIG. 10 is the first and second lead frame sections used to manufacture a plurality of diodes of the kind shown in FIGS. 6, 7 and 9.

FIG. 11 shows a side view of FIG. 10.

DETAILED DESCRIPTION OF THE PREFERRED EMBODIMENTS

Figure 1:
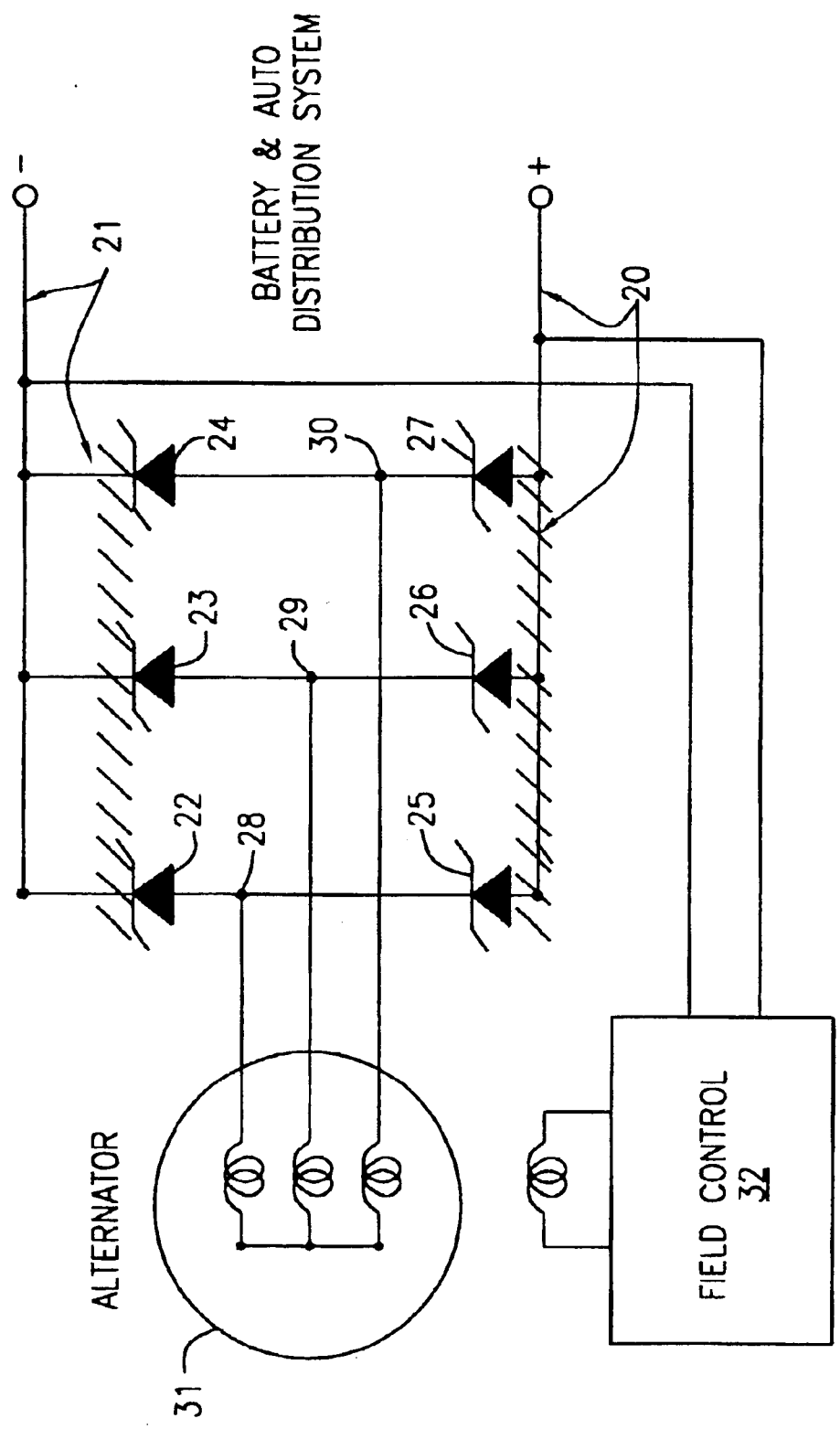
FIG. 1 is a circuit diagram of a known three-phase bridge alternator circuit for automotive alternator operation.

FIG. 1 is a circuit diagram of a typical alternator circuit to which the diode of the invention may be applied. Thus, an automotive battery may have its positive and negative terminals connected to d-c heat sink rails 20 and 21 respectively. The cathode terminals of diodes 22, 23 and 24 are connected to the common heat sink rail 21 and the anode terminals of diodes 25, 26 and 27 are connected to the common heat sink rail 20. The a-c nodes 28, 29 and 30 of the three-phase bridge are connected to the terminals of alternator motor 31 and the d-c terminals 20 and 21 are connected to the field control 32 of the field winding of the motor 31.

Figure 2:
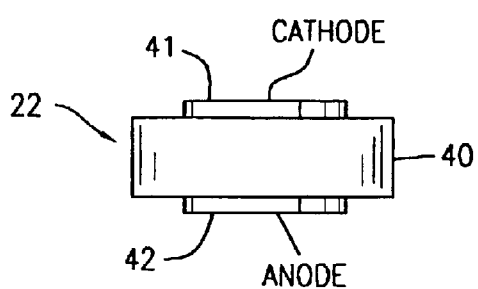
FIG. 2 is a side view of a prior art button diode.
Figure 3:
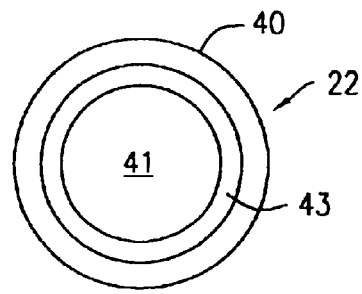
FIG. 3 is a top view of FIG. 2.

The alternator diodes 22 to 27 in the prior art have been button diodes, having the structures shown in FIGS. 2 and 3 for the case of diode 22. Thus, diode 22 has a cylindrical rim 40 with top and bottom electrodes 41 and 42 which are cathode and anode electrodes respectively, and are symmetric with respect to one another. An insulation bead, such as bead 43 insulates rim 40 from electrode 41. The anode electrode 42 is similarly insulated. A conventional silicon diode die, not shown, is contained within the rim 40 and its top and bottom electrodes are connected to electrodes 41 and 42 respectively.

Figure 4:
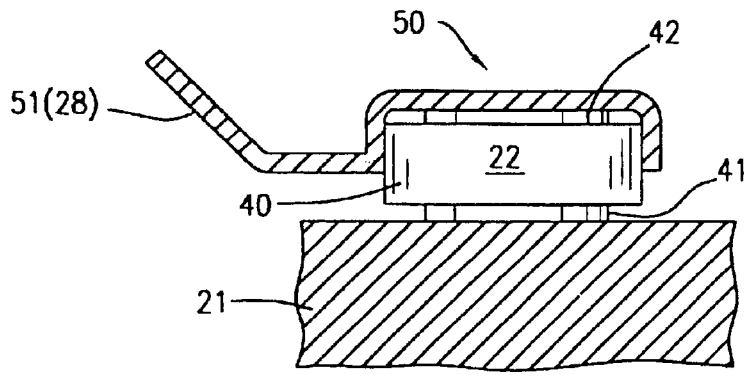
FIG. 4 is a side view in partial cross-section, of the button diode of FIG. 2 mounted on a heat sink
Figure 5:
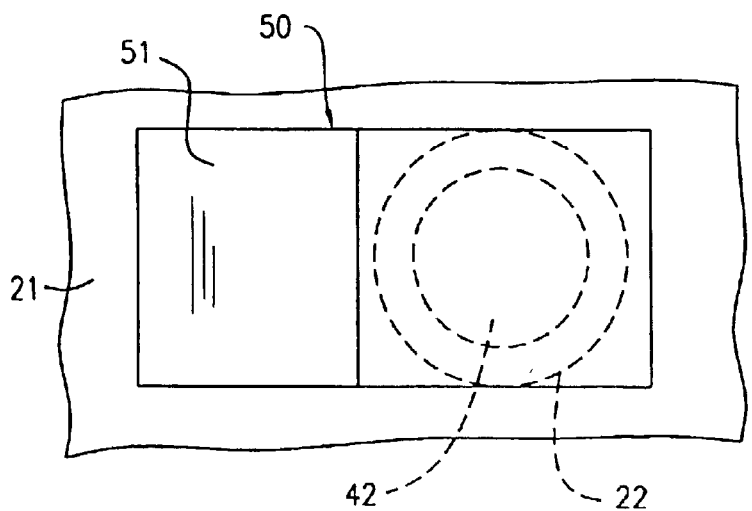
FIG. 5 is a top view of FIG. 4.

FIGS. 4 and 5 show the manner in which diode 22 is connected to negative heat sink rail 21. Thus, cathode 41 is soldered, or otherwise affixed to heat sink 21. A thin conductive spring clip 50 having an extending tab 51 is forceably clipped onto the top of diode 22 and contacts anode electrode 42 and provides the terminal for node 28 in FIG. 1.

Each of diodes 23 and 24 are similarly connected to heat sinks 21 and are arranged to have their clips connected to nodes 29 and 30 respectively.

Diodes 25, 26 and 27 are similarly constructed, but these are flipped over so that their anodes 42 are fixed to heat sink 20 and their cathodes are connected to spring clips for connection to nodes 28, 29 and 30 respectively.

Figure 6:
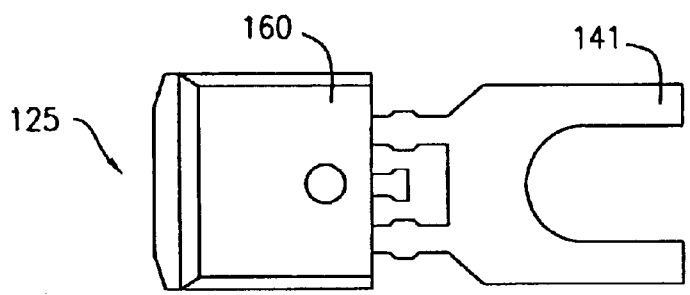
FIG. 6 is a top view of the novel diode of the invention.
Figure 7:
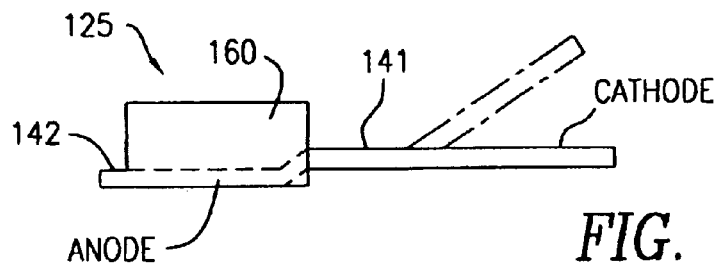
FIG. 7 is a side view of FIG. 6.

In accordance with the present invention, diodes 22 to 27 of FIG. 1 have a modified TO 220 type structure as shown in FIGS. 6 and 7 for diode 125 (which is connected at the location of diode 25 in FIG. 1).

Diode 125 has a surface mounted anode electrode 142 (FIGS. 7 and 9), an extending cathode tab-type electrode 141, and an insulation housing 160 which maybe conventionally transfer molded. The extending cathode tab 141 is forked, as shown in FIG. 6 for easy connection at node 28 in FIG. 1.

Figure 9:
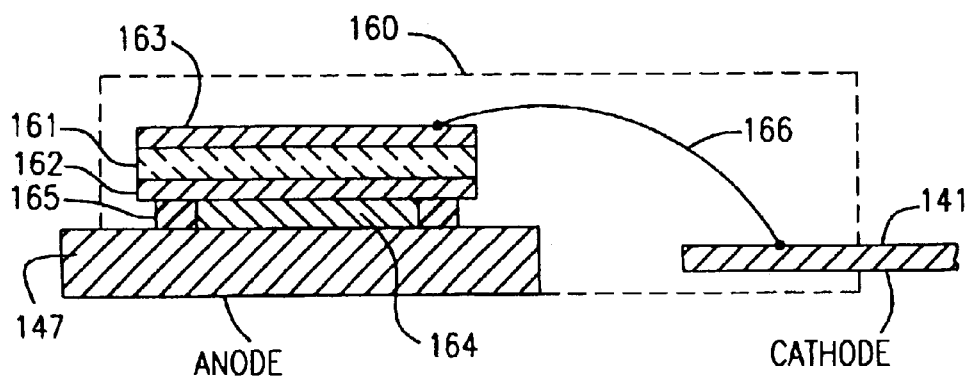
FIG. 9 is a cross-section of the diode of FIGS. 6 and 7.

The internal structure of diode 125 is best shown in FIG. 9. Thus, a silicon die 161 has conventional aluminum cathodes and anode electrodes 162 and 163 on its opposite surfaces. Anode electrode is soldered by solder mass 164 to the relatively thick first lead frame section 147. Solder mass 147 may be enclosed by insulation epoxy bead 165. The top anode electrode 163 is wire bonded by wire bond 166 to cathode terminal 141.

Figure 8:
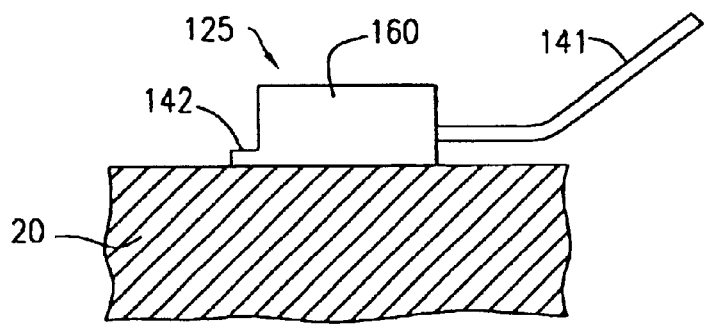
FIG. 8 is a partial cross-section of the device of FIG. 7 when mounted on a heat sink.

The bottom of anode section 147 may be metallized to be easily solderable, and the portion of cathode terminal 141 which protrudes through the side wall of insulation housing 160 is also metallized to be solderable. The anode section 147 may then be easily soldered to the top of heat sink 20 as shown in FIG. 8.

Each of the diodes in the locations of diodes 26 and 27 will have the same structure as shown in FIGS. 6, 7 and 9 and are also soldered to the common heat sink 20.

The diodes in the positions of diodes 22, 23 and 24 are identical to the diode of FIGS. 6, 7 and 9, except that the polarity is reversed. Thus, these diodes have the die 161 reversed within housing 160 in FIG. 9 so that the lead frame section 147 is a cathode and section 141 is an anode.

Figures 12, 13:
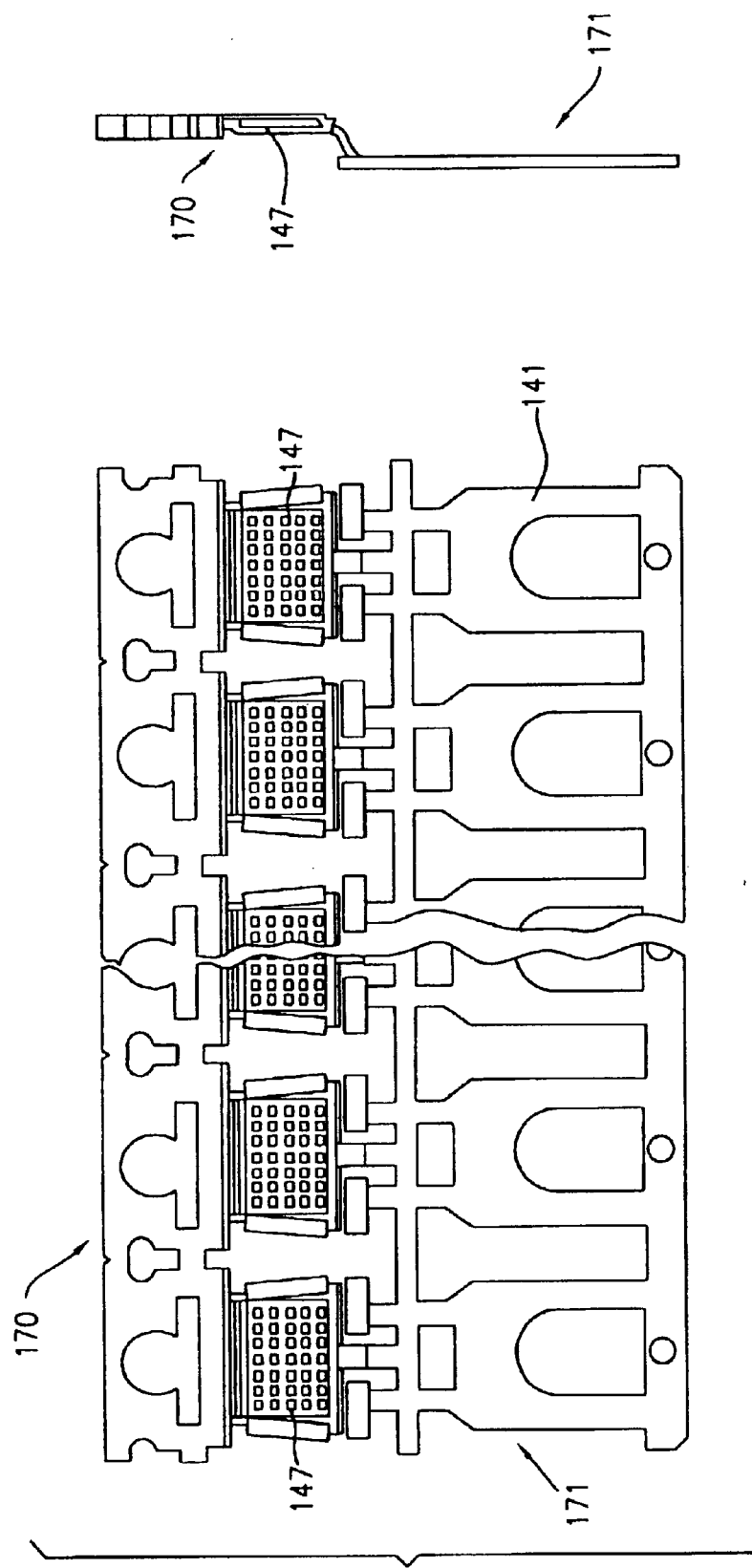
FIG. 12 shows the lead frame sections of FIG. 10 after they are welded together.
FIG. 13 is a side view of FIG. 12.

FIGS. 10 to 13 show the novel lead frame which can be used to make the device of FIGS. 6 to 9. Thus, in FIGS. 10 and 11, two lead frame sections 170 and 171 are shown. Lead frame section 170 is a lead frame which is used for a type D-2 pak lead frame and provides a relatively thick lead frame section for the first lead frame sections 147. Such D-2 pak housings are made by International Rectifier Corporation of El Segundo, Calif. The second lead frame section 171 is etched from a thin copper strip and defines the terminal elements 141 of FIGS. 6 to 9. These two strips 170 and 171 are laser welded together as shown in FIGS. 12 and 13. Silicon die 161 are then die bonded to the lead frame sections 147 and their tops are wire bonded to sections 141. The die are oriented to have cathode electrodes 163 either down or up, as needed for the diodes in locations 22, 23, 24 or 25, 26, 27 respectively. The lead frames are then overmolded with insulation plastic housing 160 and the individual segments are separated to define the individual die.

In the above devices, both in a forward and reverse configuration, various metallization may be used. Thus, the wire bond to leads may employ aluminum metallizing. The solder die attach to the heat sink may employ a Ti/Ni/Ag metallization. There are also two silicon wafer types which can be used; one with an aluminum anode and a Ti/Ni/Ag cathode; or a Ti/Ni/Ag anode and a Ti/Al cathode.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. In an automotive d-c power source for delivering power in excess of 2 KW; an alternator for generating a three phase a-c voltage; a three phase bridge connected rectifier having respective diodes connected in the six legs of said bridge; a first set of three of said diodes having one terminal connected to a positive d-c bus heat sink; a second set of three of said diodes having one terminal connected to a negative d-c heat sink; respective pairs of said first and second sets of diodes having second terminals connected to one another and to a respective one of said a-c phases of said alternator; each of said diodes comprising a flat thin silicon diode die having first and second main diode electrodes on its opposite respective surfaces, a lead frame having a relatively thick conductive section which receives one of said main diode electrodes and which supports said die, and a relatively thin conductive section which is laterally removed from and insulated from said relatively thick section, and wire bond means connecting the other of said main diode electrodes to said relatively thin conductive section, and a plastic insulation housing enclosing said die and at least portions of said relatively thick and relatively thin conductive lead frame sections and said wire bond; said relatively thick conductive lead frame section having a bottom which is exposed through said plastic housing for connection to one of said d-c heat sinks; said relatively thin conductive section defining a connection tab extending through said plastic housing and available for connection to one of said a-c phases.

2. The device of claim 1, wherein each of said diodes have a TO 220 type outline.

3. The device of claim 1, wherein the free end of said relatively thin conductive lead frame section has a forked end for bolt connection to its respective a-c phase.

4. The device of claim 2, wherein the free end of said relatively thin conductive lead frame section has a forked end for bolt connection to its respective a-c phase.

5. The device of claim 1, wherein said thin conductive lead frame section is bent at an angle out of its plane in regions external to said plastic housing.

6. The device of claim 5, wherein the free end of said relatively thin lead frame section has a forked end for bolt connection to its respective a-c phase.

7. The device of claim 1, wherein said diodes are zener diodes.

8. The device of claim 6, wherein said diodes are zener diodes.

* * * * *